United States Patent
Bulthaup et al.

(10) Patent No.: US 6,936,181 B2
(45) Date of Patent: Aug. 30, 2005

(54) METHODS FOR PATTERNING USING LIQUID EMBOSSING

(75) Inventors: Colin Bulthaup, San Mateo, CA (US); Chris Spindt, Menlo Park, CA (US)

(73) Assignee: Kovio, Inc., Sunnyvale, CA (US)

( * ) Notice: Subject to any disclaimer, the term of this patent is extended or adjusted under 35 U.S.C. 154(b) by 181 days.

(21) Appl. No.: 10/251,103

(22) Filed: Sep. 20, 2002

(65) Prior Publication Data

US 2003/0082485 A1 May 1, 2003

Related U.S. Application Data

(60) Provisional application No. 60/328,591, filed on Oct. 11, 2001.

(51) Int. Cl.[7] .......................... B44C 1/22; C03C 15/00; C03C 25/68; C23F 1/00
(52) U.S. Cl. ........................ 216/44; 264/239
(58) Field of Search ............... 216/20, 33, 35, 216/36, 40, 41, 43, 45, 44, 48, 54; 264/239, 241, 259, 293, 299, 330

(56) References Cited

U.S. PATENT DOCUMENTS

| | | | |
|---|---|---|---|
| 3,626,844 A | 12/1971 | Priesmeyer | 101/3 SP |
| 3,883,383 A | 5/1975 | Leitz, Jr. | 156/242 |
| 3,934,503 A | 1/1976 | Kinney et al. | 101/128.2 |
| 4,242,401 A | 12/1980 | Mitani et al. | 428/201 |
| 4,374,077 A | 2/1983 | Kerfeld | 264/22 |
| 4,444,808 A | 4/1984 | Kikuchi et al. | 427/143 |
| 4,487,811 A | 12/1984 | Eichelberger et al. | 428/546 |
| 4,526,098 A | 7/1985 | Bachman | 101/115 |
| 4,775,439 A | 10/1988 | Seeger, Jr. et al. | 156/231 |
| 4,808,274 A | 2/1989 | Nguyen | 204/15 |
| 4,862,799 A | 9/1989 | Hycner et al. | 101/348 |
| 4,957,808 A | 9/1990 | Arai et al. | 428/262 |
| 5,009,708 A | 4/1991 | Grunwald et al. | 106/105 |
| 5,245,932 A | 9/1993 | Ujiie | 101/128.11 |
| 5,259,926 A | 11/1993 | Kuwabara et al. | 156/659.1 |
| 5,262,357 A | 11/1993 | Alivisatos et al. | 437/233 |
| 5,279,689 A | 1/1994 | Shvartsman | 156/220 |
| 5,368,789 A | 11/1994 | Kamitakahara et al. | 264/1.33 |
| 5,466,319 A | 11/1995 | Zager et al. | 156/220 |

(Continued)

FOREIGN PATENT DOCUMENTS

| | | | |
|---|---|---|---|
| DE | 198 58 759 C1 | 3/2000 | H01L/25/065 |
| WO | WO 97/06468 | 2/1997 | |

(Continued)

OTHER PUBLICATIONS

Younan Xia et al., "Unconventional Methods for Fabricating and Patterning Nanostructures", 1999 American Chemical Society, pp. 1823–1848.

(Continued)

*Primary Examiner*—P. Hassanzadeh
*Assistant Examiner*—Roberts Culbert
(74) *Attorney, Agent, or Firm*—Haverstock & Owens LLP

(57) ABSTRACT

The current invention is directed to a method of patterning a surface or layer in the fabrication of a micro-device. In accordance with a preferred embodiment of the invention, a first mask structure is formed by depositing a layer of a first material onto the surface or layer and embossing the layer with a micro-stamp structure. The layer is preferably embossed as a liquid, which is solidified or cured to form the first mask structure. The first mask structure can be used as an etch-stop mask which is removed in a subsequent processing step or, alternatively, the first mask structure can remain a functional layer of the micro-device. In further embodiments, unmasked regions of the surface or layer are chemically treated through the first mask structure and/or a second material is deposited onto the unmasked regions of the surface or layer through the first mask structure to form a second mask structure and/or a second functional layer of the micro-device.

33 Claims, 13 Drawing Sheets

U.S. PATENT DOCUMENTS

| | | | |
|---|---|---|---|
| 5,491,114 A | 2/1996 | Goldstein | 437/233 |
| 5,512,131 A | 4/1996 | Kumar et al. | 156/655.1 |
| 5,531,944 A | 7/1996 | Frisch | 264/52 |
| 5,559,057 A | 9/1996 | Goldstein | 437/228 |
| 5,575,878 A | 11/1996 | Cox et al. | 156/247 |
| 5,576,248 A | 11/1996 | Goldstein | 437/225 |
| 5,662,040 A | 9/1997 | Mori et al. | 101/128.21 |
| 5,670,279 A | 9/1997 | Goldstein | 430/5 |
| 5,712,018 A | 1/1998 | Frisch | 428/158 |
| 5,746,868 A | 5/1998 | Abe | 156/247 |
| 5,772,905 A | 6/1998 | Chou | 216/44 |
| 5,804,017 A | 9/1998 | Hector | 156/242 |
| 5,892,230 A | 4/1999 | Goodberlet et al. | 250/361 R |
| 5,900,160 A | 5/1999 | Whitesides et al. | 216/41 |
| 5,937,758 A | 8/1999 | Maracas et al. | 101/327 |
| 5,966,580 A | 10/1999 | Watanabe et al. | 419/9 |
| 6,027,595 A | 2/2000 | Suleski | 156/230 |
| 6,039,897 A | 3/2000 | Lochhead et al. | 264/1.24 |
| 6,072,716 A | 6/2000 | Jacobson et al. | 365/163 |
| 6,089,853 A | 7/2000 | Biebuyck et al. | 425/447 |
| 6,096,247 A | 8/2000 | Ulsh et al. | 264/2.7 |
| 6,139,626 A | 10/2000 | Norris et al. | 117/68 |
| 6,180,239 B1 | 1/2001 | Whitesides et al. | 428/411.1 |
| 6,190,929 B1 * | 2/2001 | Wang et al. | 438/20 |
| 6,274,412 B1 | 8/2001 | Kydd et al. | 438/149 |
| 6,277,448 B2 | 8/2001 | Strutt et al. | 427/452 |
| 6,277,740 B1 | 8/2001 | Goldstein | 438/660 |
| 6,294,401 B1 * | 9/2001 | Jacobson et al. | 438/99 |
| 6,303,499 B1 | 10/2001 | Sato | 438/676 |
| 6,306,594 B1 | 10/2001 | Cozzette et al. | 435/6 |
| 6,309,798 B1 | 10/2001 | Reetz et al. | 430/296 |
| 6,315,851 B1 | 11/2001 | Mazurek et al. | 156/232 |
| 6,322,736 B1 | 11/2001 | Bao et al. | 264/105 |
| 6,355,198 B1 * | 3/2002 | Kim et al. | 264/259 |
| 6,375,870 B1 | 4/2002 | Visovsky et al. | 264/1.31 |
| 6,380,101 B1 | 4/2002 | Breen et al. | 438/765 |
| 6,387,787 B1 * | 5/2002 | Mancini et al. | 438/586 |
| 6,403,397 B1 | 6/2002 | Katz | 438/99 |
| 6,482,742 B1 * | 11/2002 | Chou | 438/690 |
| 6,517,995 B1 * | 2/2003 | Jacobson et al. | 430/320 |
| 6,518,168 B1 | 2/2003 | Clem et al. | 438/623 |
| 2002/0050220 A1 | 5/2002 | Schueller et al. | 101/486 |
| 2003/0016196 A1 | 1/2003 | Lueder et al. | 345/82 |
| 2003/0047535 A1 | 3/2003 | Schueller et al. | 216/41 |
| 2003/0082485 A1 | 5/2003 | Bulthaup et al. | 430/312 |
| 2003/0168639 A1 | 9/2003 | Cheon et al. | 252/500 |
| 2003/0203649 A1 | 10/2003 | Carter | 438/780 |

FOREIGN PATENT DOCUMENTS

| | | | |
|---|---|---|---|
| WO | WO 97/38810 | 10/1997 | B22F/3/105 |
| WO | WO 98/03896 | 1/1998 | G02F/1/133 |
| WO | WO 98/41898 | 9/1998 | G02F/1/16 |
| WO | WO 00/20916 | 4/2000 | G02F/1/01 |
| WO | WO 00/30869 | 6/2000 | B44F/1/14 |
| WO | WO 01/20402 A1 | 3/2001 | G03F/7/00 |
| WO | WO 01/73150 A1 | 10/2001 | C23C/8/00 |
| WO | WO 01/88540 A1 | 11/2001 | G01N/33/543 |

OTHER PUBLICATIONS

Younan Xia et al., "Soft Lithography", Chem. Int. Ed, 1998, pp. 551–564.

Olivier J.A. Schueller et al., "Fabrication of glassy carbon microstructures by soft lithography", Sensors and Actuators A72, 1999, pp. 125–139.

H. Schift et al., "Nanostructuring of Polymers and Fabrication of Interdigitated Electrodes by Hot Embossing Lithography", Microelectronic Engineering 46, 1999, pp. 121–124.

M. Colburn et al., "Step and Flash Imprint Lithography: A New Approach to High–Resolution Patterning", XP–002126733, Mar. 1999, SPIE vol. 3676, pp. 379–389.

* cited by examiner

METHODS FOR PATTERNING USING LIQUID EMBOSSING

RELATED APPLICATION(S)

This patent application claims priority under 35 U.S.C. 119(e) of the co-pending U.S. Provisional Patent Application Ser. No. 60/328,591, filed Oct. 11, 2001, and titled "MICRO-STENCIL." The Provisional Patent Application Ser. No. 60/328,591, filed Oct. 11, 2001, and titled "MICRO-STENCIL" is also hereby incorporated by reference.

FIELD OF THE INVENTION

The present invention relates to patterning surfaces or layers. More specifically, this invention relates to patterning surfaces or layers for the fabrication of micro-devices.

BACKGROUND OF THE INVENTION

Micro-mechanical, micro-electrical, and micro-optical devices are most typically fabricated using multiple mask and etching steps, which are fundamental steps in most photo-lithography processes. The etch-mask is typically formed by depositing a continuous layer of a photoresist polymer on a surface or layer, such as on a silicon wafer, to be patterned. The photoresist layer is selectively exposed through a photo-mask using a serial laser exposure. The exposed photoresist is developed and unexposed portions of the photoresist are removed. In a subsequent processing step, the unmasked regions of the surface or layer are etched or otherwise treated to pattern the surface or layer to form a first device layer. After the surface or layer has been patterned through the first mask, the first mask is removed and a second mask for forming a second device layer is formed as described above.

One of the shortcoming of photo-lithographic techniques is that many steps are needed to form a mask structure. Further, the materials that can be used to form the mask structure are limited to resists or photo-activated polymers. What is needed is a simplified method of patterning a surface or layer, which provides the ability to form mask structures from a variety of different materials.

SUMMARY OF THE INVENTION

The current invention is directed to a method of patterning using a mask. As used herein, a mask means a patterned layer that is used in a subsequent step to pattern a layer above or below the mask. In accordance with the present invention, device layers are patterned using a mask, wherein the mask provides a template for patterning the device layers in one or more subsequent processing steps. Preferably, the method of the present invention is utilized in the fabrication of micro-devices, including any combination of micro-mechanical devices, micro-electronic devices, and micro-optical devices.

The method of the current invention can be used to pattern surfaces or layers comprising silicon, metal, glass, quartz, rubber, plastic, and any other suitable material. The surface or layer can be that of a multi-layer wafer having a surface or any number layers comprising silicon, silicon oxide, silicon nitride and/or doped silicon comprising boron, phosphorus or any other suitable dopant.

The patterned layer is formed by providing a layer of a first material on the surface or layer. The layer of the first material can be provided using any number of coating and/or deposition techniques including gravure coating, jet spray, slides coating, and spin-coating techniques. The layer of first material is preferably deposited/and or coated onto the surface or layer with an average layer thickness of 4.0 microns or less. In alternative embodiments, an adhesion layer is first deposited on the surface or layer, and the layer of the first material is then deposited on the adhesion layer. The adhesion layer can be used to provide an electrical contact between an active device layer and the wafer.

The first material is any suitable material including, but not limited to, a curable polymer such as a photoresist material. The first material can also be a nano-particle solution comprising nano-particles of metals (such as Au, Ag, or Cu), semiconductors (such as CdS, CdSe, Si, Ge, or GaAs), or dielectrics (such as $SiO_2$ and $TiO_2$), which are dispersed in a suitable solvent such as Pyridine or alpha-Terpineol. Applications for nano-particle solutions and their preparation are described in U.S. patent application Ser. No. 09/334,873, filed Jun. 17, 1999, titled "Nano Particle-Based Electrical, Chemical, and Mechanical Structures and Methods of Making Same," now U.S. Pat. No. 6,294,401, and in U.S. patent application Ser. No. 09/519,722, filed Mar. 3, 2000, titled "Method for Manufacturing Electrical and Electro-Mechanical Elements and Devices by Thin Film Deposition and Imaging," the contents of which are both hereby incorporated by reference.

After the first material is coated and/or deposited onto the surface or layer, the layer of the first material is controllably displaced to define the pattern features. Preferably, the first material is in a liquid state and is controllably displaced by embossing the liquid layer of the first material using a micro-stamp structure. The micro-stamp structure is patterned with raised embossing features which define the pattern features embossed into the liquid layer.

Preferably, the micro-stamp structure is formed of poly-dimethylsiloxane (PDMS). Alternatively, the micro-stamp structure can be formed from any number of materials including silicon, metal, glass, quartz, rubber, and plastic, and can pattern a device layer with the raised embossing features using a number of chemical, mechanical, and optical methods, including the embossing techniques.

After the liquid layer is embossed with the pattern features, the embossed liquid layer is preferably cured, dried, or otherwise solidified to form the patterned layer or mask structure. The patterned liquid layer can be cured with a radiation source or may simply be dried, depending of the material used to form the first layer. The patterned liquid layer can be cured while the micro-stamp is in contact with the surface or layer, or after the micro-stamp is released from the surface or layer. Generally, the liquid layer is cured at least partially by drawing the solvent into the micro-stamp. As described in more detail below, curing, or partial curing, of the patterned liquid layer through absorption of the solvent from the liquid layer helps to form a stable pattern with a high degree of feature definition. The micro-stamp material(s) and design used, and the liquid material(s) and formulation can be judiciously selected to control the rate of solvent absorption. The preferred method of curing the patterned liquid layer will depend on the surface composition and the material(s) used to form the micro-stamp and the first layer, as well as the pattern feature dimensions and the intended function(s) of the patterned layer.

While the layer is preferably embossed while the first material is in a liquid state, the first layer can be liquified after coating or depositing the first material onto the surface or layer using thermal radiation, pressure, or any other combination of environmental conditions. Further, it is understood to be within the scope of the invention that the liquid material can have a range of viscosities during the embossing step.

In accordance with a preferred embodiment, the patterned layer or mask structure is used as an etch-stop mask in a subsequent etching step. Accordingly, unmasked regions of the surface or layer are treated with an etchant which selectively etches the unmasked regions of the surface or layer.

In further embodiments of the invention, the unmasked regions of the surface or layer are modified or otherwise treated through the pattern features. For example, the unmasked regions of the surface or layer can be exposed to a gas, a liquid, or a combination thereof, which alters the chemical composition of the unmasked regions, whereby the unmasked regions are rendered more or less reactive in a subsequent photo, chemical or photo-chemical processing step. For example, in accordance with the present invention, a silicon surface with a patterned layer can be exposed to a reactive oxygen source, thereby forming a silicon oxide barrier on the unmasked regions and rendering the unmasked regions less reactive to a subsequent wet etch.

In yet other embodiments of the present invention, a second material can be deposited through the pattern features of the first patterned layer or first mask structure, thereby coating the unmasked regions with the second material. In a subsequent step, the first patterned layer or first mask structure can be removed from the surface or layer forming a second pattern layer or second mask structure. The surface or layer can then be further processed or etched through the pattern features of the second pattern layer or second mask layer, which is then removed from the surface or layer in a subsequent processing step or remains as a functional layer in the micro-device being fabricated. The second pattern layer can be deposited using any number of deposition techniques including chemical vapor deposition and sputtering. In accordance with an embodiment of the invention the second material is gold, aluminum, platinum, metal composition, a dielectric, a semiconductor, or any other suitable metal that can be used to form a layer in a semiconductor device.

In yet other embodiments of the present invention, a patterned layer or mask structure is formed on a surface or layer of a substrate. A second layer is next formed over the patterned layer and the exposed portions of the patterned layer. The patterned layer and the second layer formed on top of it are next lifted off so that the remaining portions of the second layer form a device layer.

DETAILED DESCRIPTION OF THE PREFERRED EMBODIMENTS

Figure 1A:
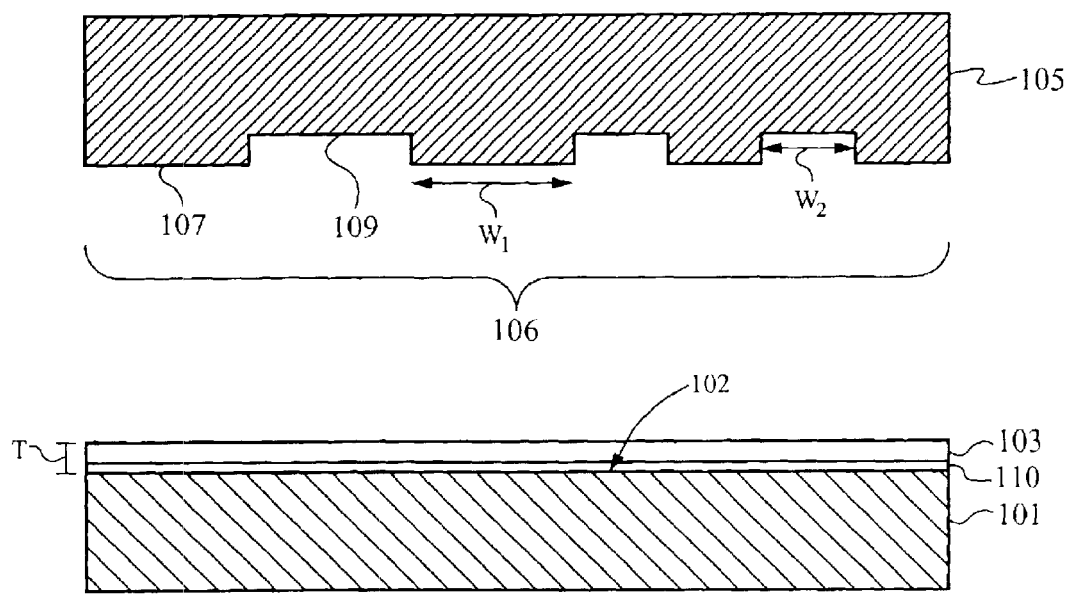
FIGS. 1A–D show forming a mask structure on a substrate surface using a micro-stamp, in accordance with the present invention.

FIGS. 1A–D illustrate cross-sectional views of a micro-stamp 105 and a method of using the micro-stamp 105 to form a first patterned layer or mask structure, in accordance with the present invention. Referring to FIG. 1A, the micro-stamp 105 comprises an embossing surface 106 patterned with raised stamp features 107 and recessed stamp features 109. Preferably, a portion of the stamp features 107 and 109 are patterned to have lateral dimensions $W_1$ and $W_2$ in a range of 100 nanometers to 100 microns depending the application at hand. The stamp features 107 and 109 can be patterned to have lateral dimensions $W_1$ and $W_2$ as small as several tens of nanometers. Preferably, the micro-stamp 105 is formed from polydimethylsiloxane (PDMS), but it may be formed from other materials, including, but not limited to, silicon, metal, glass, quartz, rubber, or plastic.

FIG. 1A also illustrates a substrate 101 having a surface 102; an interface layer 110 formed over the surface 102; and a layer of a first material 103 formed over the interface layer 110. The substrate 101 can be formed from any number of materials and composite materials including, but not limited to, silicon, silicon nitride, metal, glass, quartz, rubber, plastics, high-temperature plastics, polymers, and combinations thereof. The substrate 101 can comprise any number of layers having different chemical compositions. For example, the substrate 101 can be a wafer substrate comprising silicon with one or more layers of silicon oxide and/or silicon nitride. Alternatively, or in addition to having multiple layers, the substrate 101 can comprise dopants such as boron and phosphorus or any other dopant suitable for doping the substrate material(s).

The interface layer 110 can optionally be formed between the surface 102 of the substrate 103, and one or more subsequently patterned printed device layers. The interface layer 110 is a patterned or a continuous interface layer and preferably provides ohmic and/or rectifying contact between the one or more patterned device layers and the substrate, and also preferably helps to promote adhesion of the one or more device layers to the substrate. In accordance with other embodiments of the invention, an adhesion layer is not formed between the surface of the substrate and subsequently patterned device layers.

In accordance with the embodiments of the invention, an interface layer is formed over the substrate by depositing a liquid interface ink onto the substrate, wherein the interface ink comprises one or more precursors comprising a metal, such as, Pd, Pt, Bi, Pb, Sn, Cu, Ni, W, Al, Cr, Ti, Co, Fe or Mo and a suitable solvent. The interface precursor is preferably an organometallic complex. In yet a further embodiment of the invention, the interface precursor is a nanoparticle precursor comprising a metal, such as, Pd, Pt, Bi, Pb, Sn, Cu, Ni, W, Al, Cr, Ti, Co, Fe or Mo. The nanoparticle precursor used for forming interface layers preferably comprises nanoparticles that have sizes in a range of 1.0–100 microns and are dispersed in a suitable solvent(s) and/or surfactant(s). Further details of interface layers and a method of making the same are described in U.S. patent application Ser. No. 10/226,903, filed Aug. 22, 2002, titled "INTERFACE LAYER FOR THE FABRICATION OF ELECTRONIC DEVICES", the contents of which are hereby incorporated by reference.

Referring to FIG. 1A, an interface layer 110 has been deposited over a surface of the substrate 101 to a suitable thickness using any one of a number of deposition techniques including spin coating, ink-jet coating, sputter coating, chemical vapor deposition (CVD), extrusion coating, dip coating, or plasma enhanced chemical vapor deposition (PECVD). The interface layer 110 can be formed on the surface of the substrate 101 in many ways. For example, the interface layer can be formed by depositing the interface precursor on the entire surface of the substrate and curing. Alternatively, the interface precursor is patterned, as described below, during deposition prior to curing. In yet further embodiments the interface layer is patterned at the same time a subsequent device layer is patterned. In yet further embodiments of the invention, the patterned device layer is utilized as a mask for patterning the interface layer therebelow and/or layers below the interface layer. Preferably, after the interface layer is formed, then the active device layer is formed directly on the continuous interface layer or patterned interface layer to provide the desired electrical contact (ohmic and/or rectifying) between the active device layer and the substrate.

Still referring to FIG. 1A, a first material can be provided as the layer 103 over the interface layer 110 using any number of deposition or coating techniques including, but not limited to, gravure coating, slides coating, jet spray, and spin-coating techniques. Preferably, the layer 103 of the first material is a thin substantially continuous layer with an average thickness T of less than 4.0 microns, more preferably less than 1.0 micron and most preferably less than 0.5 microns. The first material is any suitable material, but is preferably a liquid material that can be solidified or cured or, alternatively, is a solid that can be liquefied and re-solidified upon cooling. Suitable materials include, but are not limited to, curable polymers, waxes, paraffin, metal organics, spin on glass, polyimides, nano solutions (comprising metals, semiconductors, dielectrics), or combinations thereof.

Preferably, the first material is a polymer, such as a photoresist. Alternatively, the first material is a liquid ink comprising one or more precursors comprising a metal and a solvent. Preferably, the metal comprises a nano-particle, as described below. Preferably, the metal is selected from the group consisting of Ag, Pd, Rh, Cu, Pt, Ni, Fe, Ru, Os, Mn, Sn, Cr, Mo, W, Co, Ir, Zn, and Cd. Further details of using nano-particles as inks is described in U.S. patent application Ser. No. 10/215,952, filed Aug. 9, 2002, titled "Nanoparticle Synthesis and the Formation of Inks Therefrom," the contents of which are hereby incorporated by reference.

Figure 1B:
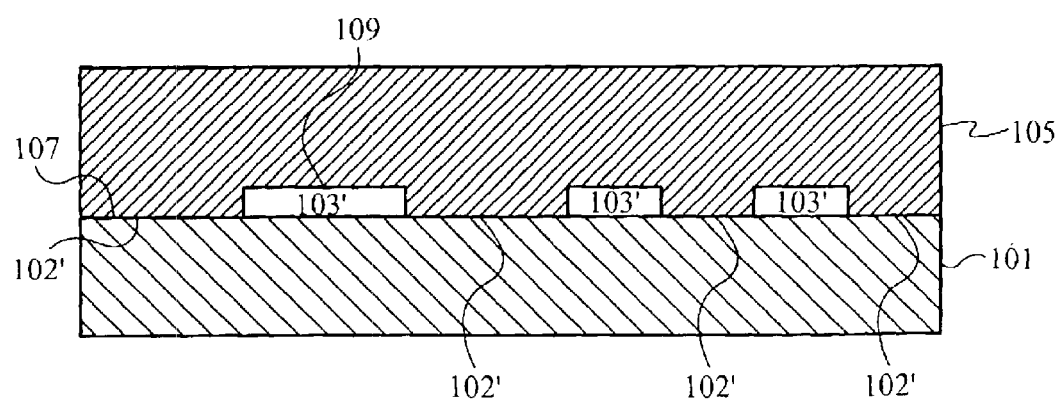
Figure 1C:
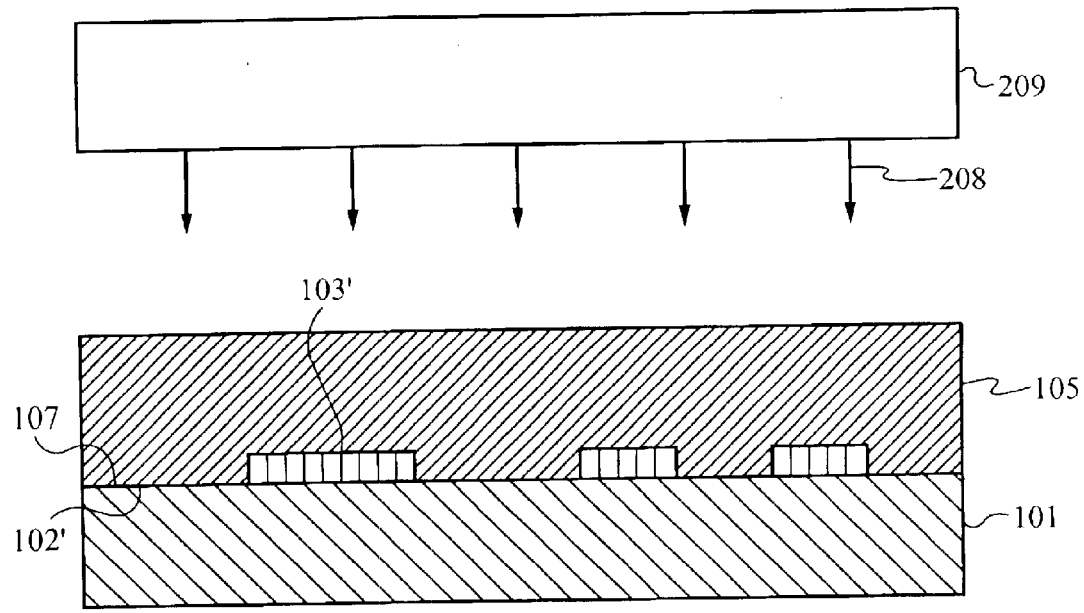
Figure 1D:
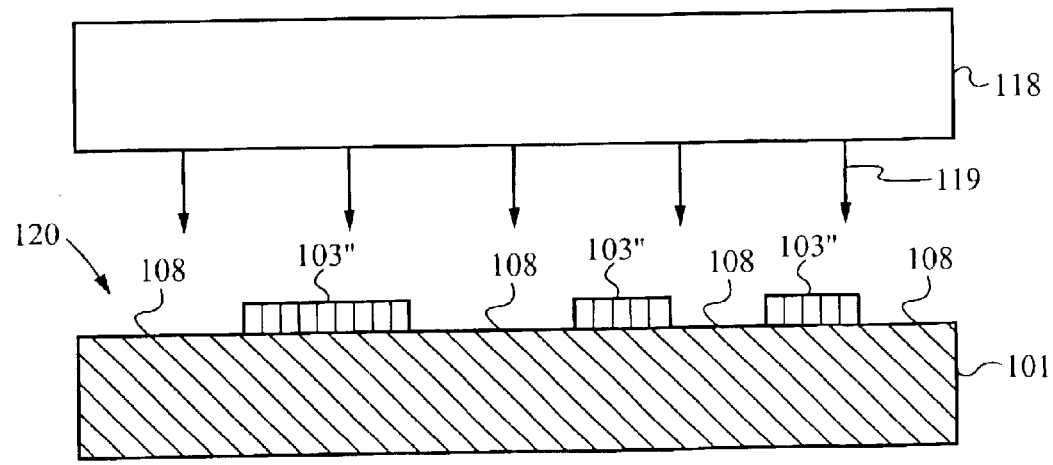

For ease of illustration, the FIGS. 1B–D do not illustrate an interface layer 110. It will be appreciated, however, that embodiments of the present invention include both structures that do and structures that do not have an interface layer between a surface of the substrate and a subsequently formed patterned device layer.

Referring now to FIG. 1B, to form the first patterned layer, portions of the liquid layer 103 are preferably controllably displaced using the micro-stamp 105. Accordingly, the micro-stamp 105 and the substrate 101 are brought together such that the raised stamp features 107 are embossed through the liquid layer and the raised stamp features 107 contact the substrate surface thereby displacing portions of the liquid layer 103 into the recessed stamp features 109 and forming a patterned liquid layer 103'. Preferably, the liquid layer 103 is sufficiently displaced, such that regions of the substrate 102' (referred to herein as the unmasked regions) where the liquid layer is displaced from the substrate surface 102 are substantially free of the first material and can be selectably treated in a subsequent processing step, as explained in detail below.

With the micro-stamp 105 against substrate structure 101 as shown in FIG. 1B, the patterned layer 103' may be partially or completely cured. In addition to patterning the liquid layer 103 through displacement of the liquid layer 103 from the protruding features 107 of the micro-stamp 105 and into the recessed features 109 of the micro-stamp 105, the micro-stamp 105 preferably also simultaneously facilities curing or partial curing of the patterned layer 103' by absorbing solvent from the liquid layer 103. Curing, or partial curing, of the patterned layer film 103' through absorption of the solvent from the liquid layer 103, helps to form a stable pattern with a high degree of feature definition. The micro-stamp material(s) and design used, and the liquid material(s) and formulation can be judiciously selected to control the rate of solvent absorption. Methods and materials for controlling the rate of solvent absorption by the micro-stamp during liquid embossing are described further in U.S. Provisional Patent Application No. 60/400,795, filed Aug. 8, 2002, titled "Controlled Print Methods," the contents of which are hereby incorporated by reference.

After the patterned liquid layer 103' is formed, as described above, then the patterned liquid layer 103' may be cured or dried using methods other than or in addition to the absorption method described above. For example, referring to FIG. 1C, the patterned liquid layer 103' can be cured or dried while the substrate 101 and the micro-stamp 105 are in contact using a suitable curing radiation 208 generated from a radiation source 209. The radiation 208 can be thermal radiation or other suitable radiation that is transmitted through the micro-stamp to the patterned liquid layer 103'. Alternatively, or in addition to the curing radiation described above, the patterned liquid layer can be cured or dried with a suitable radiation transmitted through the substrate 101. Once the patterned liquid layer 103' is cured to form the first patterned layer or mask structure, 103" then the micro-stamp and the substrate are separated to release a substrate structure 102 comprising the substrate 101 and first patterned layer 103".

Alternatively, or in addition to the curing method described above, the patterned liquid layer can be cured or dried with radiation 119 from a suitable radiation source 118 after the micro-stamp 105 and the substrate are separated, as shown in FIG. 1D.

Figure 2A:
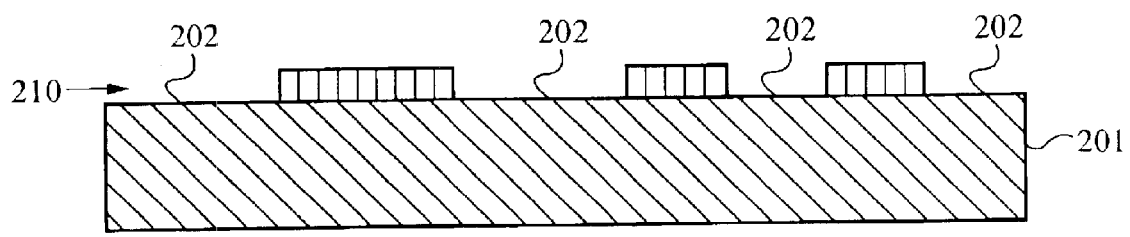
FIGS. 2A–C show patterning a surface through a mask formed with a micro-stamp, in accordance with the present invention.
Figure 2B:
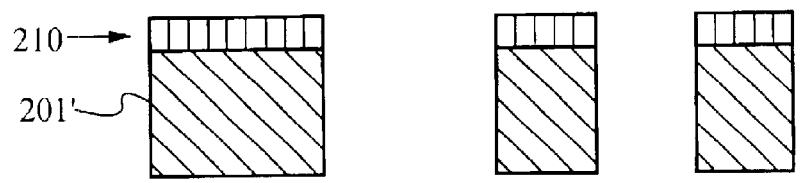
Figure 2C:

Referring now to FIGS. 2A–C, after a surface layer 201 of a substrate is provided with a first mask structure 210, such as described above, then the unmasked regions of the surface layer 202 can be selective processed through the mask structure 210. In accordance with a preferred embodiment of the invention, the surface layer 201 is selectively etched with a suitable etchant to form a pattern layer 201' as shown in FIG. 2B. The etchant can be any number of dry or wet etch materials that provide for anisotropic etching, as shown, or isotropic etching such as provided with a suitable noble gas fluorides. After the surface layer 210 is etched to form the pattern surface layer 210, the first mask structure 210 can be removed, as illustrated in FIG. 2C. Alternatively, the mask structure can be used in subsequent processing steps and/or remain a functional layer in the micro-device being fabricated.

Figure 3A:
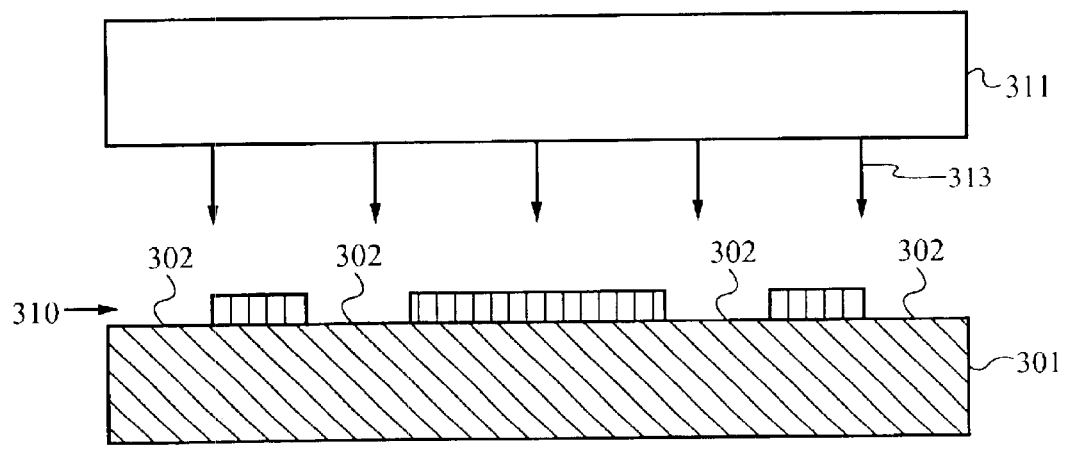
FIGS. 3A–D show treating a surface through a mask structure, in accordance with the present invention.
Figure 3B:
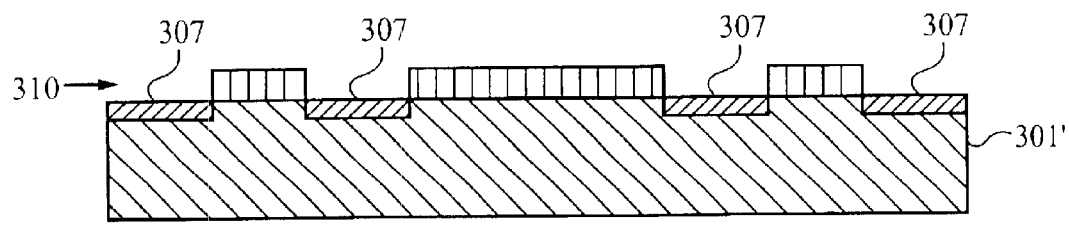
Figure 3C:
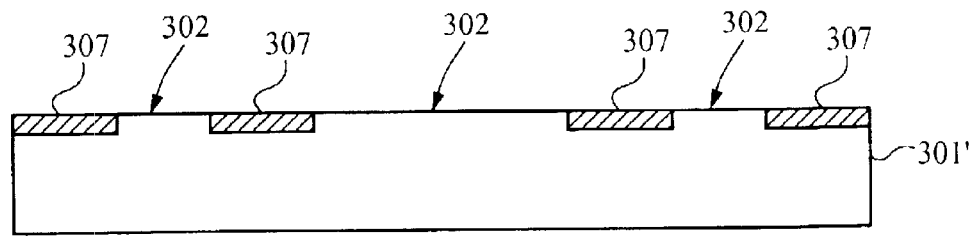

Now referring to FIGS. 3A–C, after a substrate layer 301 is provided with a first mask structure 310, as previously described, the unmasked region 302 of the surface layer 301 can be treated with any surface modifier 313 provided by a suitable source. In accordance with an embodiment of the invention, the unmasked regions 302 of the surface layer are doped with ions 313 from an ion bean source 311 to form a modified substrate layer 301' with a second patterned layer 307 having a modified chemical composition. Alternatively, the unmasked regions 302 are treated with a chemical reagent 313, such as an oxidizing agent or reducing agent to form the modified substrate layer with a second patterned layer. This treatment selectively alters the chemical composition of the unmasked region to form a second patterned layer 307 layer having a modified chemical composition.

Figure 3D:
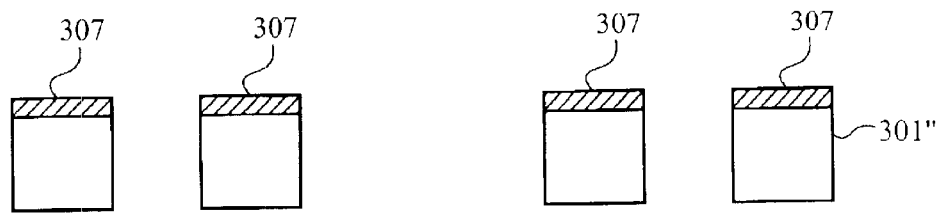

Referring now to FIG. 3C, after the second patterned layer 307 is formed, the first patterned layer or mask structure 310 can be removed from the substrate layer 301'. In a subsequent processing step, the modified substrate layer 301' can be treated with a suitable etchant to etch the substrate surface 302 through the second pattern layer 307 to form the pattern substrate layer 301", as shown in FIG. 3D.

Figure 4A:
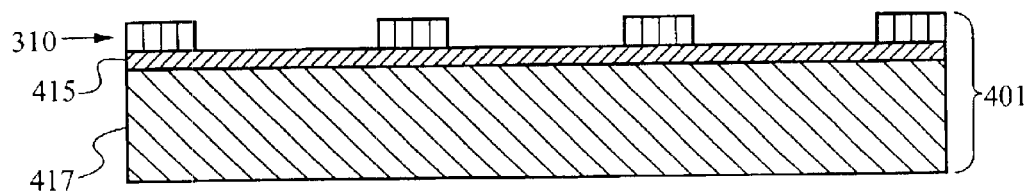
FIGS. 4A–E show patterning a surface of a multi-layer substrate through a mask formed with a micro-stamp, in accordance with the present invention.
Figure 4B:
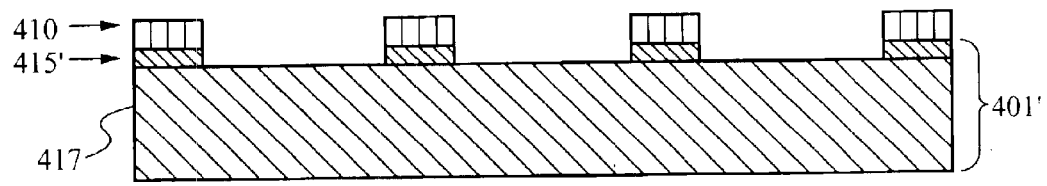
Figure 4C:
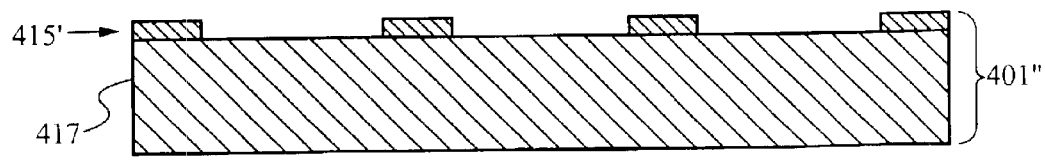

Referring to FIGS. 4A–B, a substrate structure 401 comprising a substrate underlayer 417, a substrate surface layer 415, and a first patterned layer 310 as previously described can be selectively etched through the first patterned layer 310 (functioning as a mask structure) to form the modified substrate structure with a second patterned layer 415'. The first patterned layer 310 can then be removed from the modified substrate structure 401' to form the substrate structure 401" with the second patterned layer 415', as illustrated in FIG. 4C.

Figure 4D:
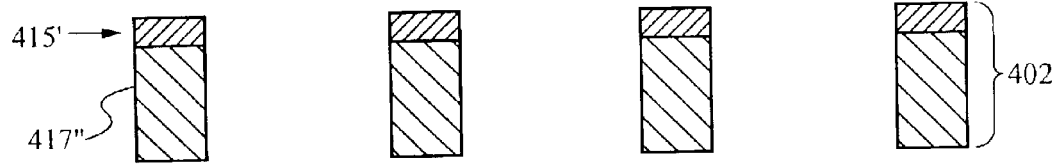
Figure 4E:

In accordance with an embodiment of the invention, the substrate layer 415 is formed from a metal which after being patterned into the layer 415' can be used to provide a conductive pathway for a micro-electronic device. In yet other embodiments, the second patterned layers 415' can be used as a second mask in a subsequent etch step, whereby the underlayer 417 is selectively etched through the second pattern layer 415' to form the patterned substrate structure 402 with a third patterned layer 417', as illustrated in FIG. 4D. The second patterned layer 415' can then be removed from the third patterned layer 417' to form the substrate structure 402', as shown in FIG. 4E or, alternatively, can remain a functional layer in the micro device.

Figure 5A:
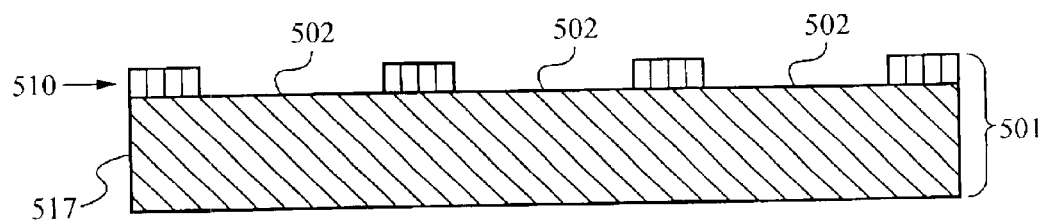
FIGS. 5A–E show forming a second mask structure by depositing a second material through a first mask structure formed with a micro-stamp, in accordance with the present invention.
Figure 5B:
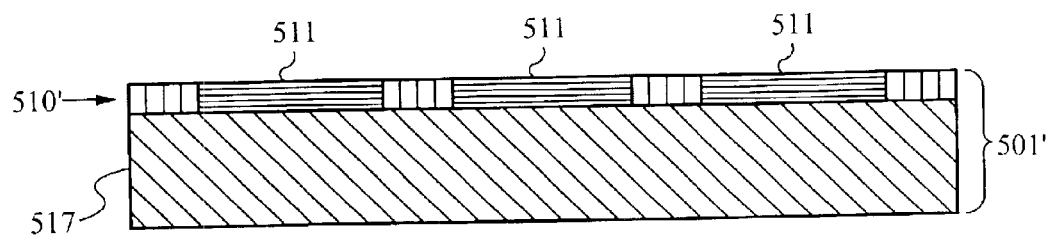

Referring now to FIG. 5A, a substrate structure 501 comprising at least one substrate layer 517 is provided with a first patterned layer 510 comprising a first material and formed with a micro-stamp, as described above. As illustrated in FIG. 5B, through the first pattern layer 510, a second material 511 is deposited, coated or otherwise applied to the substrate layer surface 502 forming a composite layer 510' comprising regions of the first material and regions of the second material 511. The second material can comprise a metal, a polymer, semiconductors, dielectrics (such as $SiO_2$ and $TiO_2$) and combinations thereof, but is preferably physically and/or chemically distinct from the first material such that the first patterned layer 510 or the second patterned layer 511 can be selectively treated in a subsequent processing step.

Figure 5C:
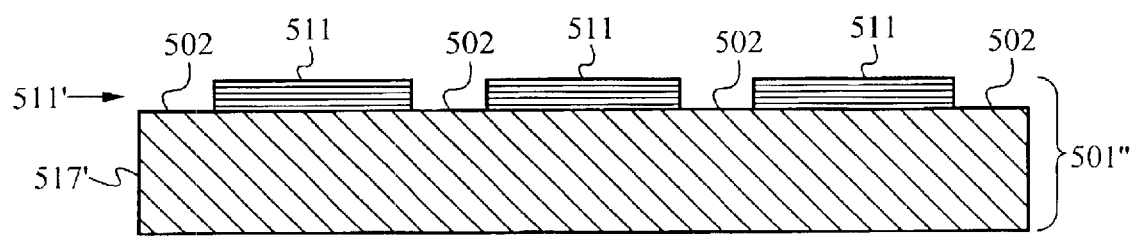

Referring now to FIG. 5C, after the second material 511 is deposited through the first patterned layer 510 to form the composite layer 510', the first material 510 is selectively removed from the surface 502 of the substrate layer 517 to form the second patterned layer 511. In accordance with a preferred embodiment of the invention the second material is a metal and the second patterned layer can be used to provide circuitry in the micro-device being fabricated.

Figure 5D:
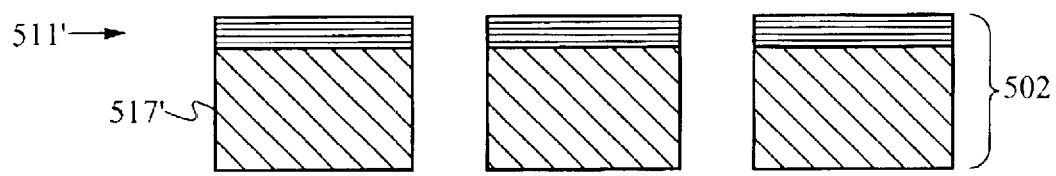
Figure 5E:
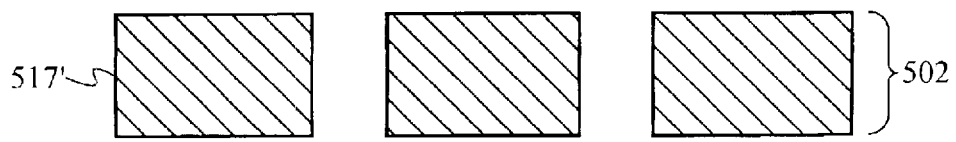

Referring now to FIG. 5D, after the first material forming the first patterned layer 510 is removed from the surface 502 of the substrate layer 517, the substrate layer 517 can be selectably etched through the second patterned layer or second mask structure 511' to form a patterned substrate layer 502. The second patterned layer 511' can be a functional or a passive layer of the micro-device being fabricated or, alternatively, the second patterned layer 511' can be removed from the patterned substrate layer 502 to form the free patterned substrate layer 502, as shown in FIG. 5E.

Figure 6A:
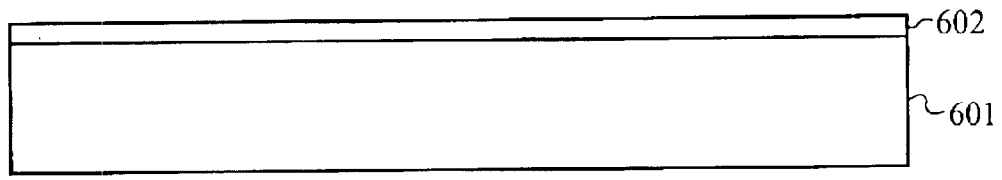
FIGS. 6A–J show forming a mask structure on a substrate surface to form a thin-film transistor in accordance with the present invention.

As illustrated in FIGS. 6A–J, the present invention can also be used to fabricate thin-film transistors. FIG. 6a illustrates a substrate 601 with a layer of liquid ink 602 covering the surface of the substrate 601. Preferably, the substrate 601 comprises silicon nitride; alternatively, the substrate can comprise a silicon, quartz, glass, metal, polymers, high-temperature plastics, or any appropriate substrate that is transparent to ultra violet light. Preferably, the liquid ink 602 comprises nano-particles such as Ag, Pd, Rh, Cu, Pt, Ni, Fe, Ru, Os, Mn, Cr, Mo, W, Co, Ir, Zn, Cd. It will be appreciated that the liquid ink can comprise any conductive nano-particle. The layer of liquid ink 602 can be deposited, coated, or otherwise applied to the surface of the substrate 601, using, for example, screen coating, dip coating, spin coating, ink-jet coating, sputter coating, slides coating, extrusion coating, meniscus coating, and spray coating. It will be appreciated that other methods can be used to deposit liquid ink over a substrate.

Figure 6B:
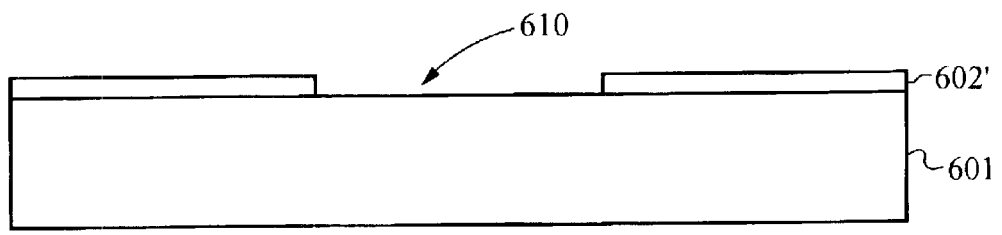
Figure 6C:
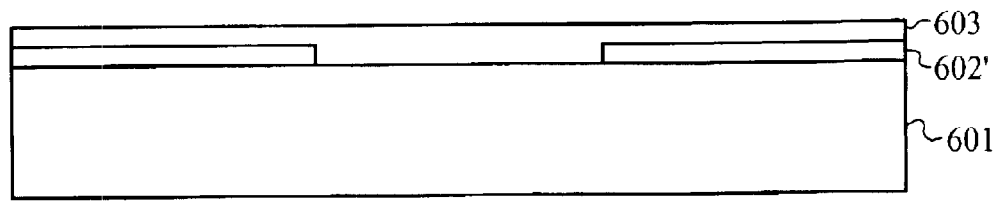
Figure 6D:
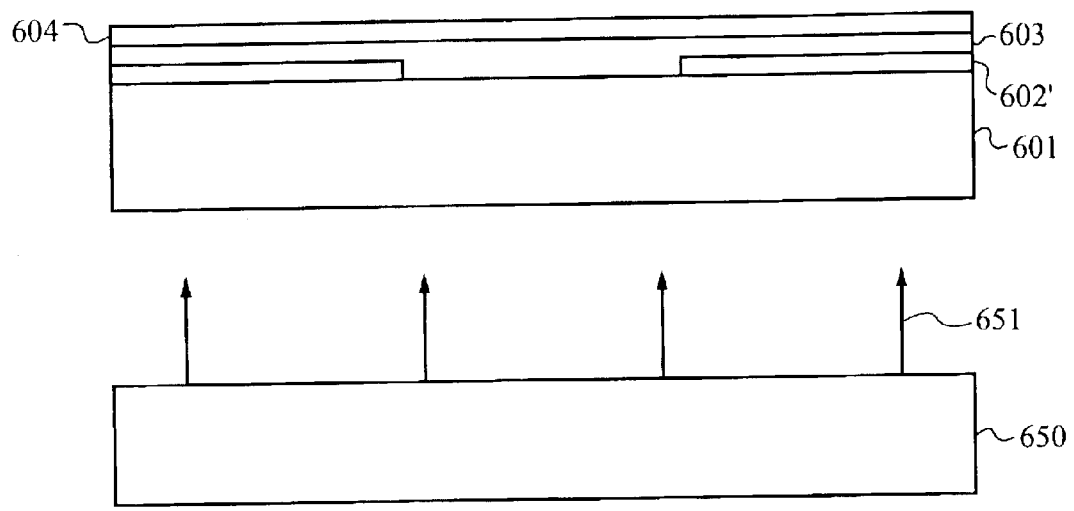

As illustrated in FIG. 6B, a liquid embossing technique, such as one using a micro-stamp to print a patterned layer as described above, is used to form a patterned surface 602' on the surface of the substrate 601. The surface of the substrate 601 now includes a patterned surface 602' and an exposed surface 610. Next, as illustrated in FIG. 6C, a silicon-based layer 603 is formed over both the exposed surface 610 and the patterned surface 602' of the substrate 601. Preferably, the silicon-based layer is an N+ doped silicon-based layer, but compositions comprising other doped silicon layers can be used. Next, as illustrated in FIG. 6D, a photoresist layer 604 is deposited, formed, or otherwise laid over the surface of the silicon-based layer 603. A radiation source 650 emits radiation 651 that travels through a back side of the substrate 601 and reacts with the photoresist layer 604. The patterned surface 602' thus functions as a self-aligned mask for the photoresist layer 604'.

Preferably the radiation source 650 is an ultraviolet radiation source and the radiation 651 is ultraviolet radiation. Alternatively, the radiation source can be another radiation source that reacts with the photoresist layer 604 to produce the patterned photoresist layer 604', illustrated in FIG. 6E.

Figure 6E:
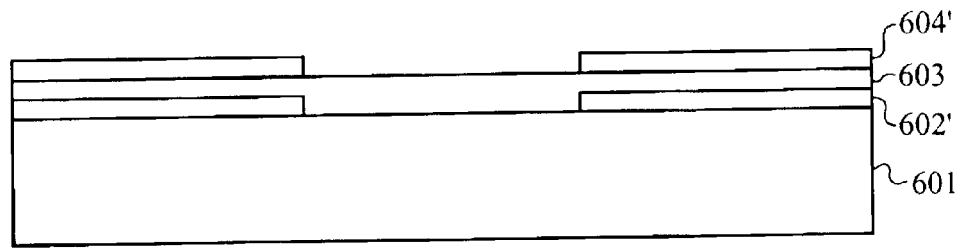
Figure 6F:
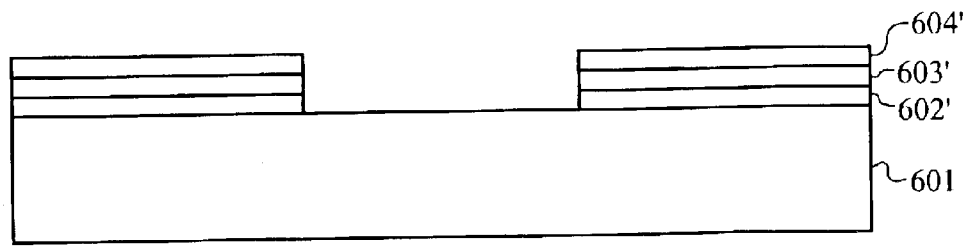
Figure 6G:
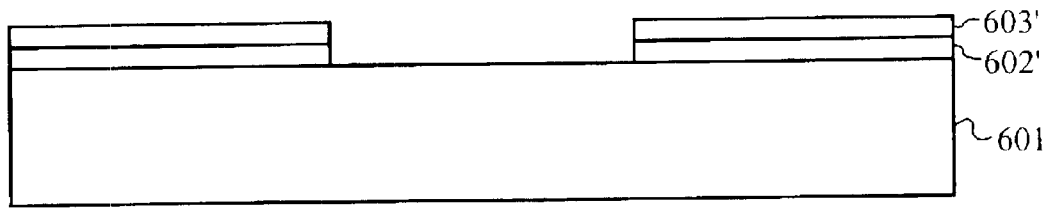
Figure 6H:
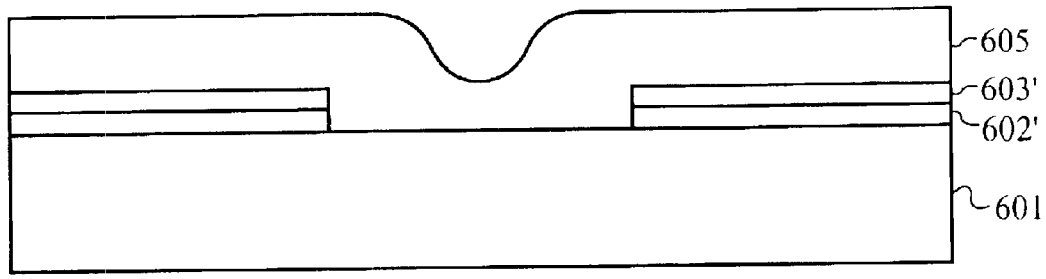
Figure 6I:
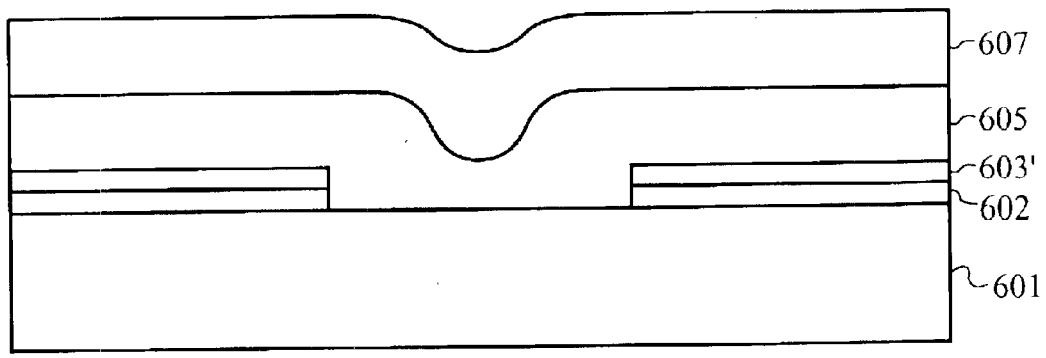
Figure 6J:
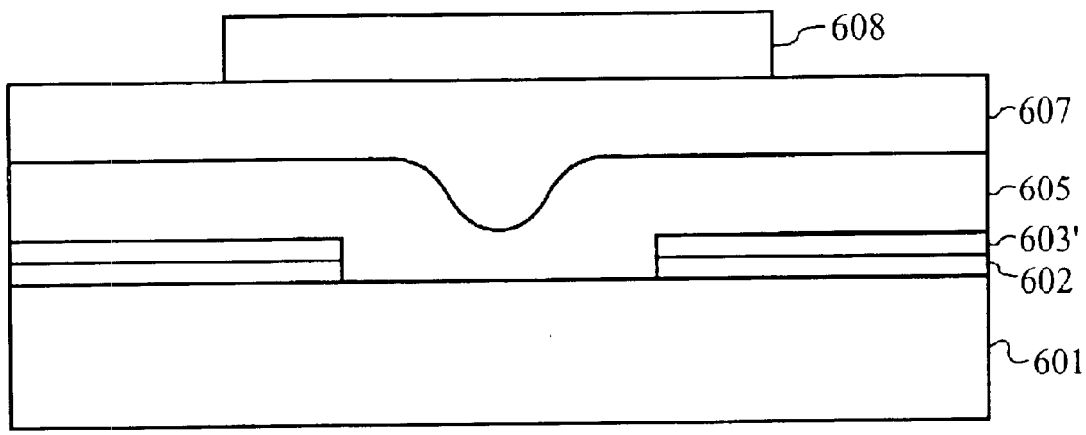

Next, the photoresist layer 604 is developed and removed, resulting in the structure illustrated in FIG. 6E. The structure is now etched, with the patterned photoresist layer 604' used as an etch stop, to produce the structure illustrated in FIG. 6F. The patterned photoresist layer 604' is now removed to produce the structure of FIG. 6G. Next, a layer of hydrogenated amorphous silicon ($\alpha$—Si:H) 605, illustrated in FIG. 6H, and then a layer of silicon nitride 607 illustrated in FIG. 6I, are formed over the structure. As illustrated in FIG. 6J, a gate structure 608 is next formed on the surface of the $\alpha$—Si:H layer.

Figure 7A:
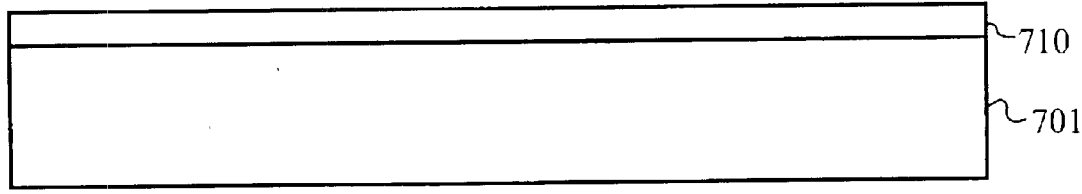
FIGS. 7A–D show forming a device layer on a substrate surface in accordance with the present invention using a lift-off technique.

The methods of the present invention can also be used with other pattern techniques, including a lift off technique, as depicted in the steps illustrated in FIGS. 7A–D. The lift off technique allows the fabrication of high-resolution devices. FIG. 7A illustrates a substrate 701 covered by a sacrificial layer 710. The substrate can be formed of any number of materials and composite materials including, but not limited to, silicon, silicon nitride, metal, glass, quartz, rubber, plastics, high-temperature plastics, polymers, and combinations thereof. The sacrificial layer 710 can be a layer of any material that can be removed using semiconductor processing techniques, as described below. In a preferred embodiment, the sacrificial layer 710 is a photoresist layer removable by a liquid etchant.

Figure 7B:
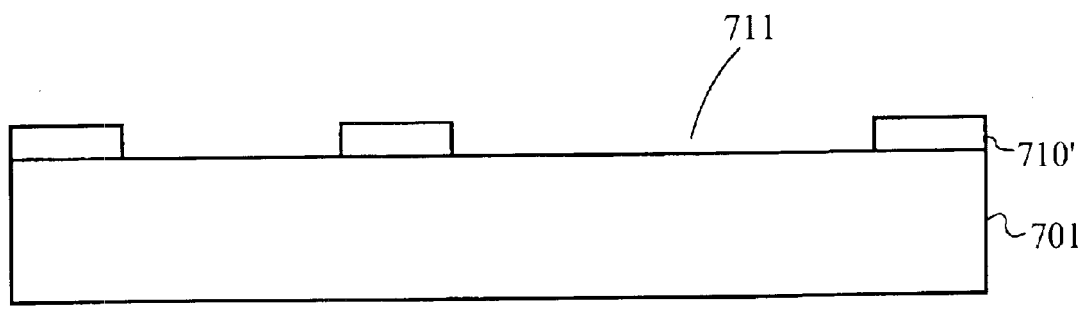
Figure 7C:
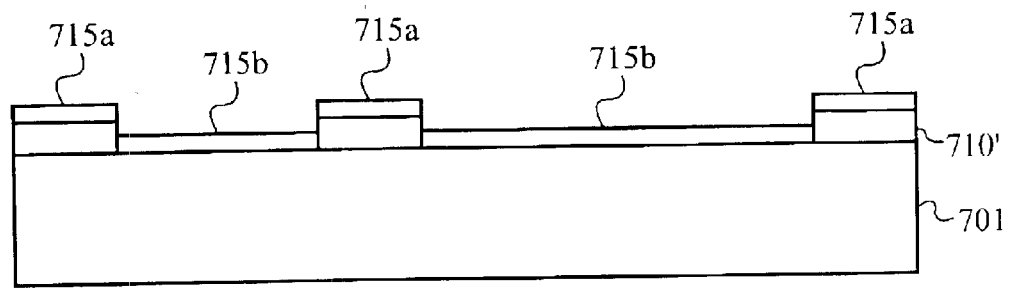

FIG. 7B shows the substrate 701 and a patterned sacrificial layer 710', formed by patterning the sacrificial layer 710 using a liquid embossing technique as described above. After the patterning step, the surface of the substrate 701 contains exposed portions 711 and the patterned sacrificial layer 710'. Next, as illustrated in FIG. 7C, a deposit layer 715 is deposited over the patterned sacrificial layer 710' to form a deposit layer 715a, and over the exposed portion of the substrate 711 to form a deposit layer 715b. The deposit layer 715 can comprise any material suitable for use as a layer in a semiconductor device. The deposit layer 715 can be any material, but in a preferred embodiment it comprises conducting materials such as nano-particles containing a metal. It will be appreciated that the thickness of the deposit layer 715 must be less than the thickness of the patterned sacrificial layer 710'.

Figure 7D:
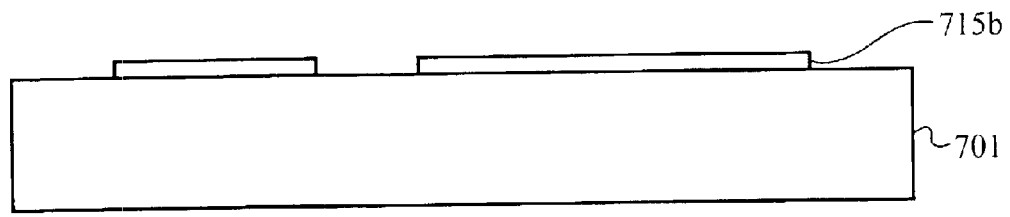

Next, as illustrated in FIG. 7D, the sacrificial layer 710' is removed. It will be appreciated that the sacrificial layer 710' can be removed using a variety of techniques. For example, if the sacrificial layer 710' is a photoresist, it can be removed using a suitable liquid etchant. By removing the sacrificial layer 710', the deposit layer 715a is also lifted off, leaving the deposit layer 715b on the surface of the substrate 701, forming a patterned device layer.

Figure 8A:
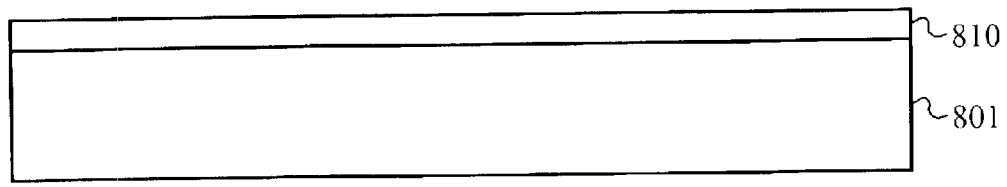
FIGS. 8A–F show forming a plating layer between a photoresist pattern in accordance with the present invention.

Embodiments of the present invention can also be used to form device layers using plating methods, as illustrated in FIGS. 8A–F. FIG. 8A illustrates a substrate 801 covered with a device layer 810. The device layer 810 can be formed of any material suitable for use as a layer, for example, in a semiconductor device. Thus, for example, the device layer can be formed from a polymer, a metal, a photoresist, a semiconductor, or a dielectric. The device layer 810 can deposited using spin coating or other deposition techniques.

Figure 8B:
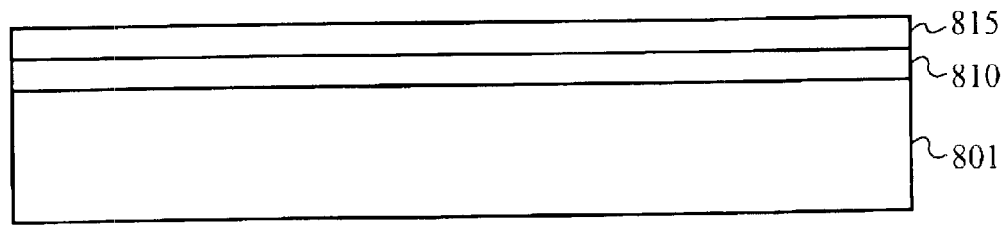
Figure 8C:
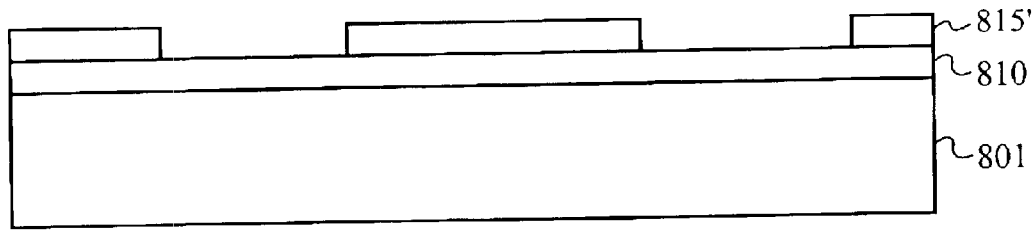
Figure 8D:
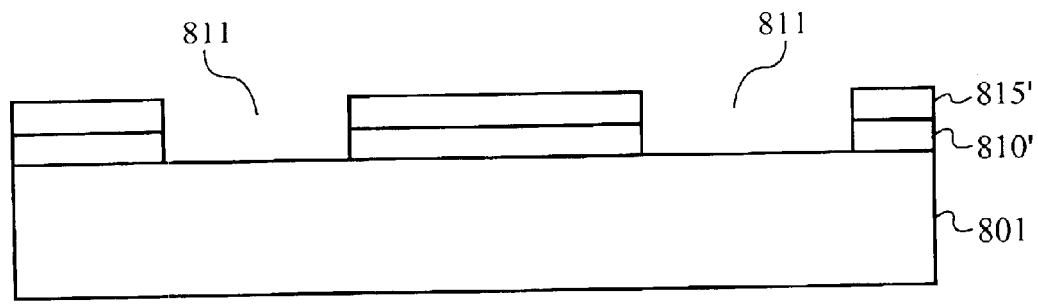
Figure 8E:
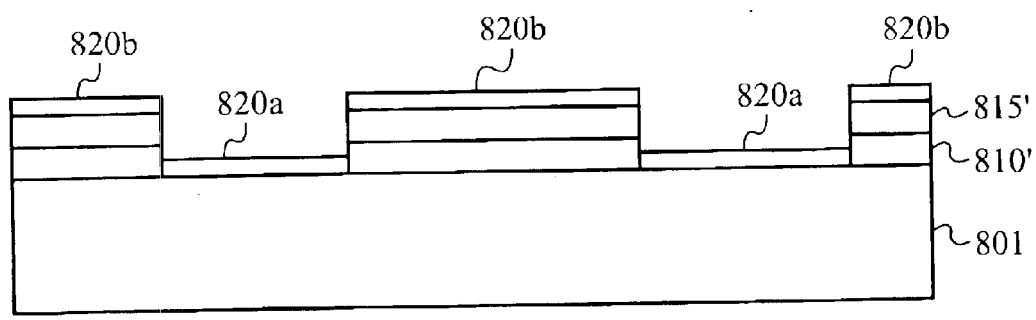
Figure 8F:
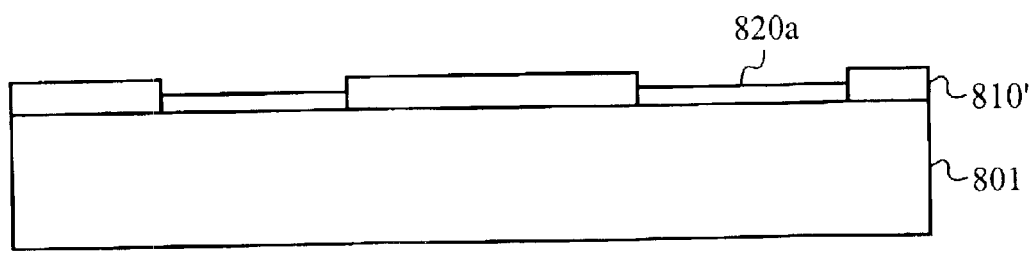

As illustrated in FIG. 8B, a second, opaque layer 815 is deposited over the device layer 810. Next, as illustrated in FIG. 8C, the opaque layer 815 is patterned into a patterned opaque mask 815' using, for example, a liquid embossing technique as described above. Next, as illustrated in FIG. 8D, exposed portions of the device layer 810 are removed as, for example, by a liquid etching technique, to produce the patterned layer 815'. This step exposes a surface 811 of the substrate 801. Next, as illustrated in FIG. 8E, a material 820 is deposited over the substrate 801 to form a layer 820a and over the patterned opaque mask 815' to form a layer 820b. Next, the patterned layer 815' is removed to lift off the layer 820b and thus form the structure illustrated in FIG. 8F.

It will be appreciated that device layers can be fabricated in accordance with the present invention using the above methods, as well as other methods, including etching techniques as well as techniques using shadow masks to illuminate exposed areas at an oblique angle, or any combination of techniques described herein.

The present invention provides an alternative to photolithographic methods for fabricating devices with micron and sub-micron features. The method of the present invention provides for the ability to directly emboss a patterned mask structure on a suitable substrate, which can be used in subsequent processing steps to pattern an underlying surface or layer and/or form other patterned mask structures, whereby the mask structures are then removed or remain as functional layers in a micro-fabricated device. The method of the invention is particularly useful for building circuitry in microelectronic devices.

The examples above describe forming a semiconductor device using liquid embossing and conventional device fabrication methods to form layers of the semiconductor device. It will be appreciated that in accordance with the present invention, the layers of a semiconductor device can be formed using any combination of liquid embossing, micro-stenciling, other methods of contact printing, over etching, shadow masking, lift-off techniques, plating, and other fabrication methods.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications can be made in the embodiment chosen for illustration without departing from the spirit and scope of the invention.

What is claimed is:

1. A method of patterning a surface comprising:
    a. providing a layer of liquid comprising a first material over the surface;
    b. controllably displacing portions of the layer to form a liquid pattern comprising patterned features;
    c. treating the liquid pattern to form a solid pattern comprising the patterned features; and
    d. forming an interface layer over the surface before the step of providing the layer of liquid comprising the first material over the surface, wherein the interface layer comprises a liquid ink.

2. The method of claim 1, further comprising depositing a second material onto portions of the substrate surface through the patterned features.

3. The method of claim 2, further comprising removing the solid pattern.

4. The method of claim 3, further comprising etching the surface.

5. The method of claim 1, wherein the first material is controllably displaced with a stamp structure having raised surfaces defining the patterned features.

6. The method of claim 5, wherein the stamp comprises a polymeric material.

7. The method of claim 5, wherein the polymeric material is polydimethylsiloxane (PDMS).

8. The method of claim 1, wherein the surface comprises silicon.

9. The method of claim 1, wherein the first material comprises a curable polymer.

10. The method of claim 9, wherein the curable polymer is a polyimide.

11. The method of claim 1, wherein the liquid ink comprises one or more precursors comprising a metal and a solvent.

12. The method of claim 11, wherein the metal is Pd.

13. The method of claim 11, wherein one of the one or more precursors is an organometallic complex.

14. The method of claim 11, wherein one of the one or more precursors is a nanoparticle precursor.

15. The method of claim 14, wherein the nanoparticle precursor comprises a metal.

16. The method of claim 15, wherein the metal is Pd.

17. The method of claim 1, further comprising:
a. depositing a second layer over a portion of the surface not covered by the solid pattern; and
b. removing the solid pattern.

18. A method of masking a substrate comprising:
a. depositing a first layer comprising a first masking material onto a surface of the substrate;
b. embossing a first set of mask features into the first layer; and
c. forming an interface layer over the surface before depositing the first layer, wherein the interface layer comprises a liquid ink.

19. The method of claim 18, wherein the first set of mask features are embossed into the first layer with a stamp.

20. The method of claim 19, wherein impressions of the first set of mask features are patterned into a surface of the stamp structure comprising a polymeric material.

21. The method of claim 18, further comprising curing the first layer.

22. The method of claim 21, wherein the first layer is cured with a radiation source.

23. The method of claim 22, wherein the first masking material is a polymer photoresist.

24. The method of claim 18, further comprising depositing a second masking material through a portion of the first set of mask features.

25. The method of claim 24, further comprising removing the first layer thereby forming a second set of mask features.

26. The method of claim 25, further comprising etching a portion of the surface through the second set of mask features.

27. The method of claim 24, wherein the second masking material comprises a metal.

28. The method of claim 18, wherein the substrate surface comprises silicon.

29. The method of claim 18, further comprising:
a. depositing a second layer over a portion of the surface not covered by the first set of mask features; and
b. removing the first set of mask features.

30. The method of claim 29, wherein the second layer comprises a metal.

31. A method of patterning a wafer, comprising:
a. applying a photoresist over a surface of the wafer;
b. patterning the photoresist using liquid embossing so that exposed and unexposed portions are formed over the surface of the wafer;
c. coating at least the exposed portions of the surface of the wafer with a first material;
d. removing the photoresist so that a patterned layer of the first material remains over the surface of the wafer; and
e. forming an interface layer over the surface before applying a photoresist over a surface, wherein the interface layer comprises a liquid ink.

32. The method of claim 31, wherein the first material is a layer of liquid ink comprising metal nanoparticles.

33. The method of claim 32, wherein the metal nanoparticles comprise Ag.

* * * * *